United States Patent [19]

Mykkanen et al.

[11] Patent Number: 4,785,248
[45] Date of Patent: Nov. 15, 1988

[54] AIR IONIZATION CONTROL MEANS

[75] Inventors: C. Fred Mykkanen; David R. Blinde, both of Minneapolis, Minn.

[73] Assignee: Honeywell, Inc., Minneapolis, Minn.

[21] Appl. No.: 787,417

[22] Filed: Oct. 15, 1985

[51] Int. Cl.$^4$ .......................................... G01K 29/12
[52] U.S. Cl. ..................................... 324/457; 324/72; 361/213; 361/220; 361/231
[58] Field of Search .................. 324/457, 72; 361/213, 361/220, 231

[56] References Cited

U.S. PATENT DOCUMENTS

| | | | |
|---|---|---|---|
| 4,318,042 | 3/1982 | Eda et al. | 324/457 X |
| 4,321,546 | 3/1982 | Schneider et al. | 324/457 |
| 4,349,783 | 9/1982 | Robson et al. | 324/457 |
| 4,476,514 | 10/1984 | Mykkanen | 361/213 |
| 4,502,093 | 2/1985 | Saurenman | 361/231 |
| 4,630,167 | 12/1986 | Huggins | 361/213 |

OTHER PUBLICATIONS

Jonassen, Ions, Space Charge and Fields.

*Primary Examiner*—Reinhard J. Eisenzopf
*Assistant Examiner*—Robert W. Mueller
*Attorney, Agent, or Firm*—Orrin M. Haugen; Thomas J. Nikolai; Frederick W. Niebuhr

[57] ABSTRACT

Air ionization control apparatus comprising a plurality of emitter lines suspended in the atmosphere above a work space, each line comprising a plurality of ion emitting stations spaced therealong and emitting positive and negative ions into the atmosphere with an elongated electrical conductor averaging bar, insulatedly mounted in the atmoshere among said stations for receiving an induced charge representative of the average level of ionization of the atmosphere. An electrical charge sensing means connected to the averaging bar is employed to provide a signal indicative of the average level of ionization present in the room environment.

1 Claim, 2 Drawing Sheets

AIR IONIZATION CONTROL MEANS

TECHNICAL FIELD

This invention relates to the field of condition control of indoor spaces, and particularly to means for minimizing the undesirable presence of static electricity in spaces used for manufacturing or processing where costly items can be ruined or costly procedures can be impeded by static electricity.

BACKGROUND OF THE INVENTION

In a prior U.S. Pat. No. 4,476,514, it is taught that maintaining a degree of ionization in the atmosphere of work spaces results in neutralization of unwanted electric charges, and it discloses apparatus for accomplishing this. Spaced pairs of insulated conductors maintained at high positive and negative voltages with respect to ground are suspended near the ceiling of a work space, and the conductor pairs are equipped with ionizing points to emit positive and negative ions into the atmosphere.

Further experience has made it evident that it is desirable to maintain a certain degree of ionization in the air at bench top level, and a co-pending application Ser. No. 550,688, filed Nov. 10, 1983, and assigned to the assignee of the present application, discloses apparatus for determining the ambient electric field at any desired location. This enables automatic control of the ionization apparatus to maintain ionization at a desired state.

Measuring apparatus of the sort described in the '688 application, when mounted on a bench top, or on a wall at bench top level, is subject to accidental physical damage, and is also subject to momentary electrical effects due to the charges on persons moving near or past the apparatus, to cause undesired variation of the ionization equipment. It has been found, for example, that when this sensing device is located near a conveyor belt, objects moving on the belt past the ion sensing device possess sufficient charges to cause undesired adjustment of the ion generation equipment.

To observe or monitor the level of ionization of the air in a large work space would, however, require either the use of a large number of the measuring devices, or transportation of a measuring device about the space for use at various locations. I have discovered a method and apparatus by which a single measuring device can be used to give an indication of ionization conditions at bench level throughout a large space.

Various advantages and features of novelty which characterize the invention are pointed out with particularity in the claims annexed hereto and forming a part hereof. However, for a better understanding of the invention, its advantages, and objects attained by its use, reference should be had to the drawings which form a further part hereof, and to the accompanying descriptive manner, in which there is illustrated and described a preferred embodiment of the invention.

BRIEF DESCRIPTION OF THE DRAWINGS

In the drawing, in which like reference numerals identify corresponding parts throughout the several views.

DESCRIPTION OF THE PREFERRED EMBODIMENT

Figure 1:
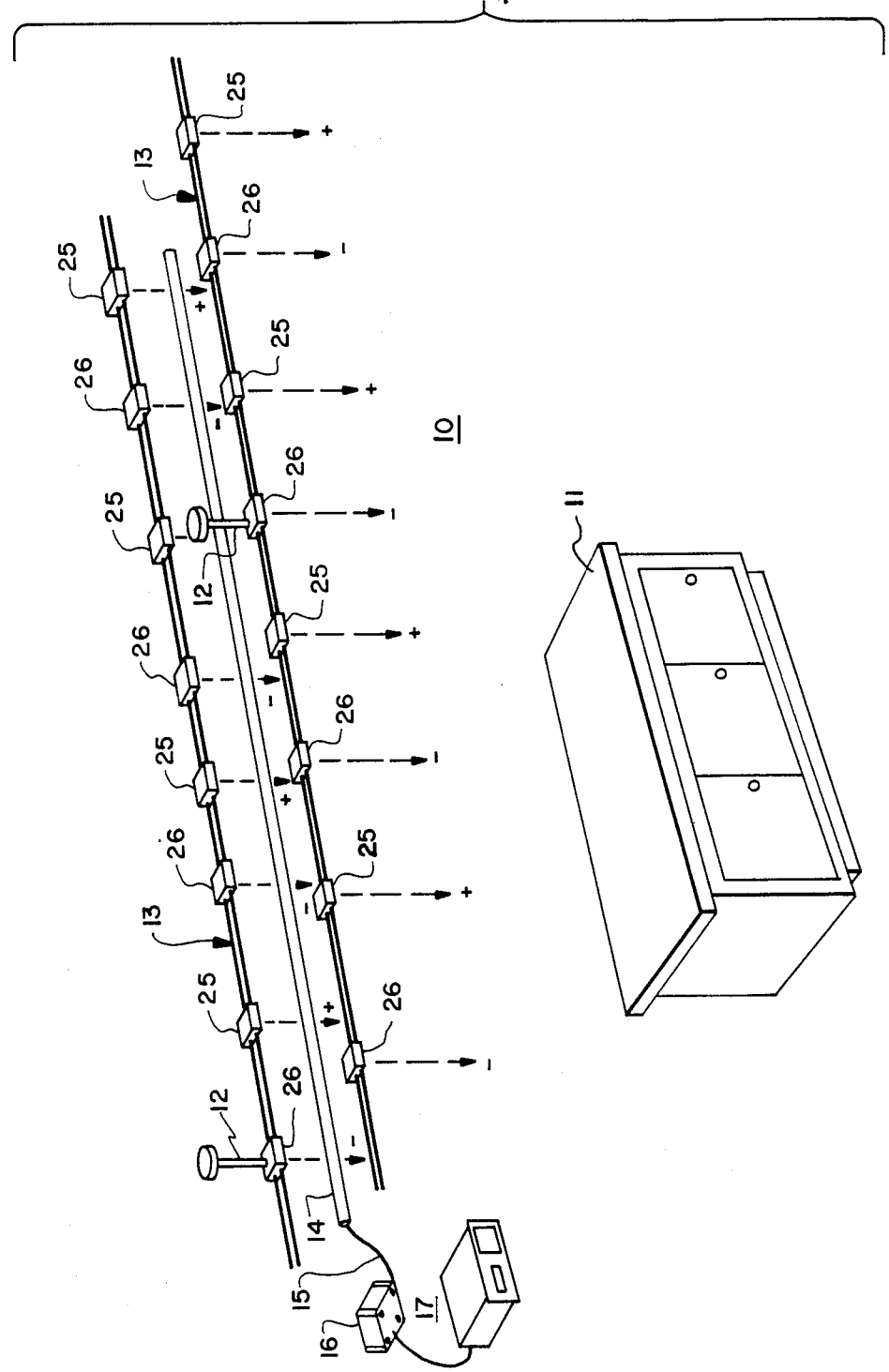
FIG. 1 is a schematic showing in: perspective of a work space having installed therein apparatus according to the invention for practicing the inventive system.

Turning now to FIG. 1, there is shown a work space 10 including a plurality of work bences, one of which is shown at 11. Suspended from the ceiling of the space by insulating spacers 12 are emitter lines 13, two being shown. Also suspended and insulated from the ceiling is an "averaging bar" 14, which, in practice, can conveniently comprise a length of thin wall rigid-electrically conductive tubing. The averaging bar is preferably centered between two of the emitter lines, and may be at the same height. It is connected directly to or by a short conductor 15 to a voltage sensing fixture 16 of a voltage monitor 17.

Figure 2:
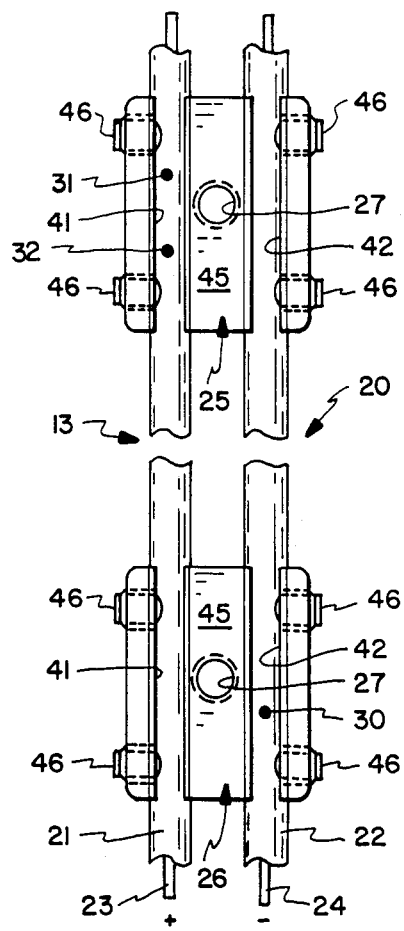
FIG. 2 shows a known ionizing; arrangement

For completeness of disclosure, details of an emitter line 13 as in U.S. Pat. No. 4,476,514 are shown in FIG. 2. It consists of a dual cable 20 comprising a pair of wires 21 and 22 insulated for high voltages, having stranded conductors 23 and 24 connected to 18,000 volt current-limited direct current generators not shown. Conductor 23 is positive with respect to ground, and conductor 24 is negative. Positive and negative corona discharge stations 25 and 26 are located alternately along the wires at 16 to 18 inch intervals, and are provided with tapped mounting holes 27 for receiving spacers 12.

At each negative corona discharge station 26, a needle point 30 passes through stranded conductor 24 and projects downwardly beyond the insulation of the wire, and at each positive station 25 a pair of similar needle points 31 and 32 are provided.

Each discharge station comprises a spacer comprising a block of insulating material having a pair of laterally spaced grooves 41 and 42 extending parallel to and spaced inwardly from opposite edges of the block. The grooves are separate by a ridge 45, and are of width to permit wires 21 and 22 to be forced into them, and to be held by oval tipped insulating set screws 46.

Figure 3:
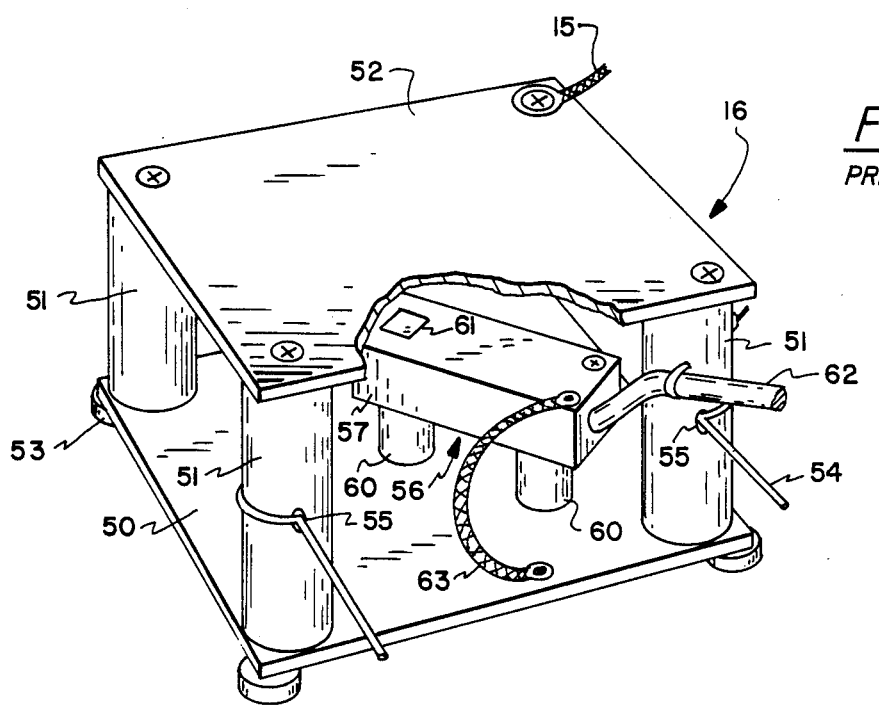
FIG. 3 shows a known voltage; measurement fixture.

To further complete the disclosure, details of a voltage sensing fixture according to application Ser. No. 550,688 are shown in FIG. 3. It comprises a ground plate 50 upon which are mounted insulating spacers 51 which support a floating plate 52. The fixture may be mounted on insulated feet 53 or suspended as by a fish line 54 secured to holes 55 in spacers 51. A probe 56 having a grounded casing 57 is mounted on plate 50 by spacers 60. It has a viewing window 61, and is connected to monitor 17 by a suitable cable 61. Plate 50 is grounded to case 57 by a cable 63.

FIG. 1 shows a single pair of positive and negative emitter pairs with the averaging bar located at the same height and midway between them. It is not necessary that the height of the averaging bar be the same as that of the lines, but if there are only two sets of emitter lines, the bar should be equally spaced from them both.

In large spaces where there is a grid of emitter lines, a single averaging bar is still sufficient, but it no longer need be equidistant from two lines, or even aligned with the emitter pairs, which are usually parallel. The averaging bar may even run perpendicular to the direction of the emitter lines. There need be no relation between the length of the lines and the length of the bar. It has been found that a single 10-foot length of conductive conduit serves satisfactorily as an averaging bar regardless of the number and length of the emitter pairs in the factory space whose ionization level is being controlled.

OPERATION

The operation of the system in general terms is as follows. The electrically floating conductive plate 52 normally takes on a potential determined by the ionization of the ambient air proximate its location, and this potential is detected by probe 56 and used, as desired, to indicate the level of ionization or to control the amplitude of the voltage supplied to discharge points 30, 31, and 32. By reason of the electrical connection 15 between floating plate 52 and averaging bar 14, the sensor 16 is made responsive to the ionization levels at a large number of points. It has been found by experiment that the response of a sensing fixture 16, connected to an averaging bar as described is very well in agreement with the responses of plural sensing fixtures positioned on several bench tops throughout the work area.

Numerous characteristics and advantages of the invention have been set forth in the foregoing description, together with details of the structure and function of the invention, and the novel features thereof are pointed out in the appended claims. The disclosure, however, is illustrative only, and changes may be made in detail, especially in matters of shape, size, and arrangement of parts, within the principle of the invention, to the full extent indicated by the broad general meaning of the terms in which the appended claims are expressed.

The embodiments of the invention in which an exclusive property or right is claimed are defined as follows:

1. Apparatus for use in a system for controlling the ionization of air in the atmosphere of a work space having a ceiling, said apparatus comprising:

(a) a first emitter line insulatively supported from said ceiling in said atmosphere;
   (b) a second emitter line insulatively supported from said ceiling in said atmosphere, said second line being in substantial parallel relationship to said first emitter line, and each of said lines comprising (i) first and second electrical conductors insulatively supported in spaced apart parallel relationship, and (ii) ion emitter means disposed along the length of said first and second emitter lines at spaced apart locations adapted, when said first and second conductors are electrically energized, to inject positive and negative ions into said atmosphere;
   (c) an ungrounded ion averaging elongated electrically conductive bar means insulatively supported from said ceiling and positioned in said atmosphere midway between and effectively at the same elevation relative to the ceiling as said first and second emitter lines, the length of said bar means being sufficient to span a predetermined number of said ion emitter means whereby said ion averaging elongated electrical conductive bar means is at a floating potential and receives an electrical charge representative of the average state of ionization of said atmosphere; and
   (d) electrical charge sensing means electrically connected to said elongated electrical conductive bar means to thereby (i) receive a signal indicative of said electrical charge, and (ii) serve as a means for enabling control of the electrical energization of said first and second electrical conductors of said emitter lines to thereby maintain ionization at a pre-selected state at work stations located in said work space.

* * * * *